United States Patent [19]
Doty et al.

[11] Patent Number: 5,508,615
[45] Date of Patent: Apr. 16, 1996

[54] SUPERSONIC SAMPLE SPINNER

[76] Inventors: F. David Doty, 701 Burmaster Dr.;
Lester G. Hacker, 320 Burmaster Dr., both of Columbia, S.C. 29223;
Jonathan B. Spitzmesser, 219 Mountain Valley Rd., Blythwood, S.C. 29016

[21] Appl. No.: 284,446

[22] PCT Filed: Feb. 25, 1991

[86] PCT No.: PCT/US91/01225

§ 371 Date: Feb. 25, 1991

§ 102(e) Date: Feb. 25, 1991

[87] PCT Pub. No.: WO92/15023

PCT Pub. Date: Sep. 3, 1992

[51] Int. Cl.[6] ............................................ G01V 3/00
[52] U.S. Cl. .................................... 324/321; 324/318
[58] Field of Search .............................. 324/321, 318, 324/322, 300, 307, 308, 311

[56]  References Cited

U.S. PATENT DOCUMENTS

| | | | |
|---|---|---|---|
| 3,588,677 | 6/1971 | Keiman et al. | 324/321 |
| 4,899,111 | 2/1990 | Pines et al. | 324/321 |
| 5,202,633 | 4/1993 | Doty et al. | 324/321 |
| 5,289,130 | 2/1994 | Doty | 324/321 |
| 5,325,059 | 6/1994 | Doty | 324/321 |

Primary Examiner—Louis M. Arana
Attorney, Agent, or Firm—Michael A. Mann

[57] ABSTRACT

Whirl forces in a high-speed hydrostatic air bearing are reduced by orienting the gas supply nozzles so that the pressurized gas enters the bearing opposite to the direction of rotation of the shaft. Stiffness also is thereby increased. Stable operation at supersonic surface speeds may thus be achieved. Diffuser chamfers may be added to the bearing surface to enhance performance at very high pressure ratios. This anti-whirl air bearing is effectively used to support a nuclear magnetic resonance cylindrical sample container capable of high-speed spinning for line-narrowing of solid samples. Motive power required to spin the container at supersonic surface speeds is provided by radial-inflow microturbines with tip diameter less than the bearing diameter and supersonic inlet gas velocities. An axial thrust bearing is included between the microturbine and the sample container. A five-part stator housing construction allows the radio frequency magnetization coil to be supported at minimal spacing from the sample container. The enhanced gas bearings are also beneficial in double rotation NMR experiments.

21 Claims, 4 Drawing Sheets

SUPERSONIC SAMPLE SPINNER

BACKGROUND OF THE INVENTION

1. Field of the Invention

The field of this invention is high speed sample spinners, especially for nuclear magnetic resonance or ultra-centrifuge, employing hydrostatic gas bearings and radial-inflow microturbines.

2. Background of the Invention

Nuclear magnetic resonance (NMR) is a technique used to identify, compare and analyze molecular structures and compositions of materials. NMR is particularly difficult to apply to solid samples because of the effects of strong dipolar and higher order line broadening mechanisms from rigid neighboring nuclides. Many of the techniques developed for averaging out these effects include high speed spinning of the sample at various angles in the external magnetic field. A particularly lucid and eloquent statement of the various solids NMR techniques may be found in the opening discussion of U.S. Pat. No. 4,899,111. The primary object of this invention is the ability to achieve much higher spinning speeds at much greater stability and efficiency than previously could be obtained so as to permit improved analytical resolution under certain conditions.

Several spinners for nuclear magnetic resonance are well known. In U.S. Pat. No. 4,456,882 Doty discloses a technique for high speed sample spinning using cylindrical, ceramic sample containers with press-fit plastic turbines on hydrostatic air bearings. Several improvements are disclosed in U.S. Pat. No. 4,739,270 by Daugaard et al. A co-pending application, Ser. No. 07/607,521, discloses novel radial-inflow microturbines and other improvements appropriate for high temperature applications. Other small, high-speed, air bearings are disclosed in U.S. Pat. Nos. 3,969,822, and 4,366,993, and the references cited therein. Other NMR MAS spinners are disclosed in U.S. Pat. Nos. 4.254,373, 4,275,350, 4.511,841. 4,899,111 and the references cited therein.

Various techniques have been proposed to control whirl in gas bearings with varying degrees of success under various conditions. Some proposed techniques have probably contributed to increased whirl, such as the rotor depressions described in U.S. Pat. No. 4,521,190.

For larger bearings it is feasible to insert compliant metal foils, as disclosed by Warren, U.S. Pat. No. 4,552,466. and Sargent, U.S. Pat. No. 4,332,427. that create symmetric constriction zones, thereby largely eliminating the possibility of an asymmetric force due to viscous pumping of the gas by the rotating spindle. The overlapping-foil bearing is not only difficult to produce, it also has low stiffness and is ineffective at low speeds as it is hydrodynamic.

Herring-bone patterns in the bearing stator, as discussed by Yang and Munday in "A Grooved Self-Acting Beating for Use in Cryogenic Expansion Turbines", *Cryogenic Processes and Equipment* Vol. 79 (1982), have also been moderately effective, but they are extremely difficult to implement in small journal beatings. The balanced eccentric geometry of Romberg, U.S. Pat. No. 4,222,617, is also very difficult to manufacture, since tolerance requirements are typically under 1.5 µm. Acoustically resonant chambers have been shown to be effective over a narrow speed range in the reference by Voth et al. but again they are difficult to apply to small systems. Converging-diverging shaft and bearing contours have been used by Miyake et al, U.S. Pat. No. 4,486,105, to reduce supersonic shock and improve stiffness at very high pressure ratios.

Radial-axial mixed-flow aluminum microturbines have been used as expansion machines in cryogenic refrigerators for three decades, and microturbines have been widely used by the dental industry for even longer. However, there is a need for a stable, high speed NMR sample spinner.

SUMMARY OF THE INVENTION

According to its major aspects, the present invention is a nuclear magnetic resonance sample spinner comprising a housing having a stator and a rotor within the stator turning freely on a gas bearing, and one or more turbines in operative connection with the rotor for driving the rotor under pressure of gas received through a manifold incorporated in the housing. The spinner has means for directing gas counter to the rotation of the rotor.

Directing gas flow counter to the rotation of the rotor is a particular feature of the present invention. The counter flow reduces whirl and increases stability at speeds from zero to supersonic. Furthermore, larger bearing clearances are possible between rotor and stator so that friction is minimized above 50% of the speed of sound, and stiffness is much greater at all speeds. Diffuser chamfers may be added to the bearing surface to enhance performance at very high pressure ratios. Thus greater speeds are possible with corresponding increases in resolution and sensitivity in many NMR experiments. The enhanced gas bearings are also beneficial in double rotation NMR experiments.

The turbines are radial-inflow, non-metallic microturbines with tip diameters less than the bearing diameter for receiving gas at supersonic velocities. An axial thrust bearing is included between the microturbine and the sample container. A five-part stator housing construction allows a radio frequency magnetization coil to be supported at minimal spacing from a sample container within the rotor. Higher isentropic efficiency and enhanced performance is achieved by the preferred, purely radial-inflow turbine design.

Preferably, the sample spinner uses a supersonic vaneless diffuser as the inlet of the microturbine to enhance supersonic performance. The inlet is preferably chamfered to reduce shock and the consequent viscous heating.

Other features and advantages will be apparent to those skilled in the art of nuclear magnetic resonance measurements from a careful reading of the Detailed Description of a Preferred Embodiment accompanied by the following drawings.

DETAILED DESCRIPTION OF A PREFERRED EMBODIMENT

Figure 1:
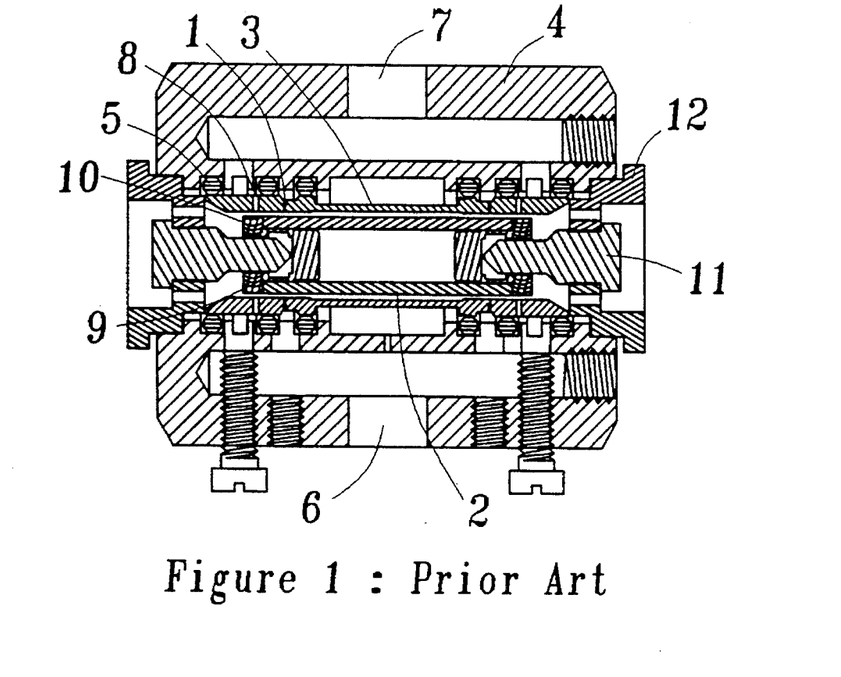
FIG. 1 illustrates a prior an high speed NMR sample spinner.

The widely used, prior art high-speed NMR sample spinner shown in FIG. 1 has hydrostatic air bearing orifices 1 introducing pressurized gas radially to support the ceramic journal or rotor 2 inside the ceramic stator 3. The stator 3 is supported inside the housing 4 on o-rings 5. A bearing manifold 6 is provided inside the housing 4 for distribution of air to the bearing orifices. A drive manifold 7 is provided for distribution of air to the drive nozzles 8. Impulse or Pelton turbine flutes 9 are formed in the turbine caps 10 for rotor drive. A marginally stable, axially centralizing equilibrium exists when the drive is precisely symmetric and the rotor is spinning smoothly. Centering points 11 mounted in the housing caps 12 are required to approximately center the rotor during start-up and slow-down.

Figure 2:
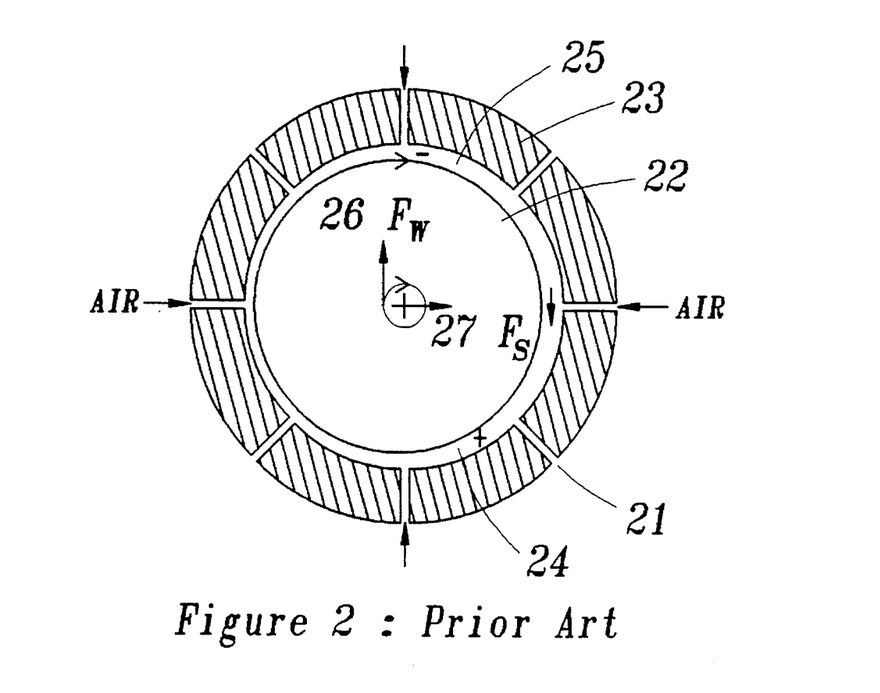
FIG. 2 illustrates the whirl phenomenon in the prior art air bearing.

The whirl phenomenon is illustrated with reference to FIG. 2. When the rotor 22 is displaced slightly from concentricity within the stator 23, the shaft rotation pumps the gas to a higher mean pressure on the converging side 24 than on the diverging side 25. This gives rise to the whirl force 26 perpendicular to the hydrostatic restoring force 27 from bearing holes 21. The mean rotational speed of the air mass between the rotor and stator is approximately half the rotational speed of the rotor surface. As a result, at rotational frequencies somewhat below half of the static resonant frequencies as calculated from bearing stiffness and rotor moments, the rotor will whirl, that is, the rotor's center will execute a small-radius orbit. The addition of pockets on the inside of the bearing at the gas orifice exits does not appreciably affect this phenomenon.

Figure 3:
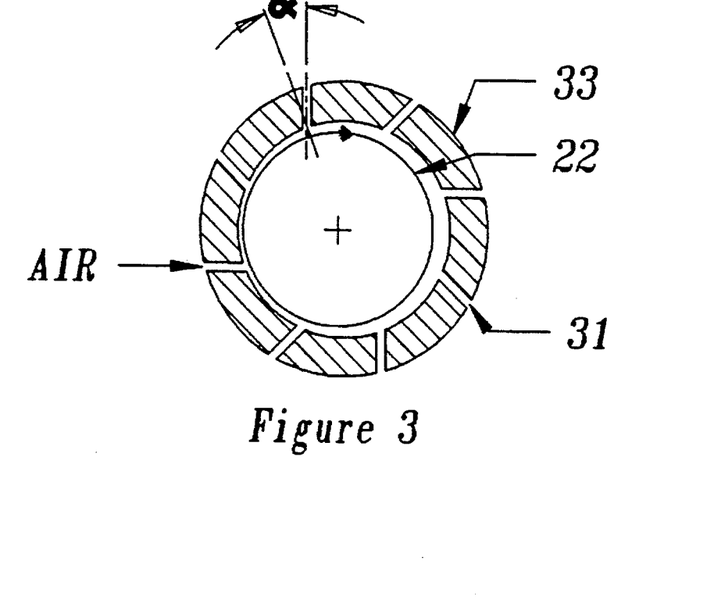
FIG. 3 illustrates a cross section of the anti-whirl hydrostatic journal bearing according to a preferred embodiment of the present invention.

FIG. 3 illustrates the anti-whirl configuration of the instant invention, which, under a wide variety of high-speed conditions, significantly improves stability. The pressurized gas is admitted into the bearing clearance by orifices 31 that are opposed to the direction of rotation. The bearing orifices are inclined at reverse circumferential angles $\alpha$ typically greater than 15° from normal at the inside surface of the stator 33, although angles as small as 10° are also quite beneficial. The optimum angle is a function of the surface speed of the rotor 22 at which the bearing is to be optimized and the nature of the objective function being optimized. For surface speeds comparable to the speed of sound c where it is necessary to minimize friction, the optimum circumferential angle is typically 15°–30°. The orifices may also be inclined at small longitudinal angles when an axial velocity component is needed or other constraints so dictate, but the holes will usually lie in a plane perpendicular to the axis of the rotor.

Figure 4:
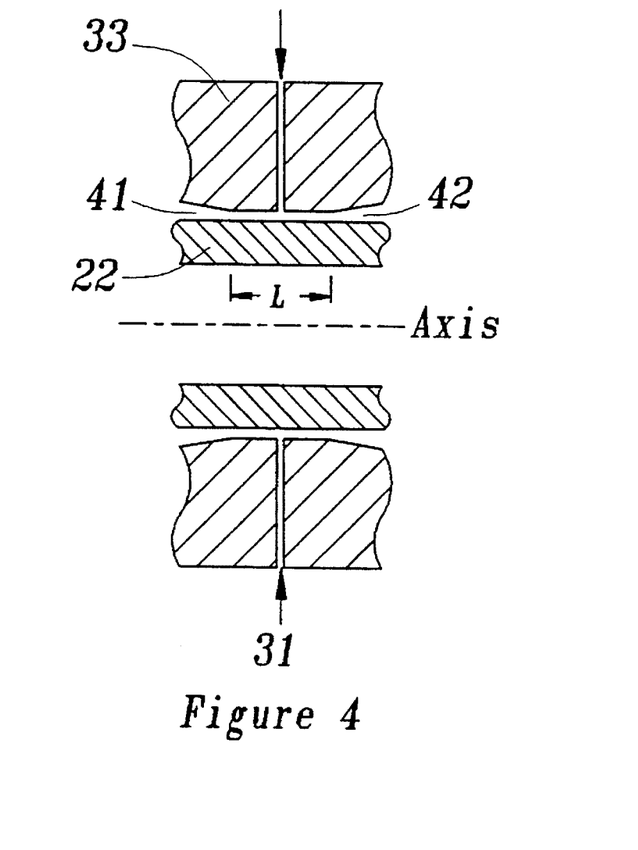
FIG. 4 illustrates an axial section of the anti-whirl journal bearing with diffuser chamfers.

The resulting shock at the orifice exit produces substantial viscous and adiabatic heating, but this may be offset at high speeds by reducing the axial bearing length L as shown in FIG. 4 to typically 35–70% of the diameter. The net result is an increase in friction compared to the prior art at relatively low surface speeds—below 0.3 c. However, at supersonic speeds, the shorter bearing length and increased radial clearance now made possible result in a net reduction in bearing friction. Optimum bearing axial length not including the chamfers is typically one half the diameter of the shaft. Optimum bearing clearance is typically about 20% larger than prior art, partially as a result of reduced choking from the larger elliptical opening of the orifice into the bearing clearance. Optimum bearing orifice diameters are slightly larger than prior art, but the optimum number of orifices is reduced from typically a minimum of 8 for the prior art to 6–12. Some further stiffness enhancement is possible at very high pressure ratios by adding diffuser chamfers 41, 42 as shown in FIG. 4 for improved pressure recovery at the bearing exit edge.

For a supersonic rotor 14 mm in diameter supported by room temperature air at 0.5 MPa exhausting into atmosphere, optimum bearing radial clearance is about 30–40 µm and optimum bearing orifice diameter is 0.25–0.3 mm. For a 3.5 mm rotor in room temperature air, the optimum bearing clearance is 20–25 µm and the optimum bearing hole diameter is 0.12–0.16 mm. For small (3.5 mm) cryogenic helium rotors, the optimum bearing clearance is typically 5–20 µm and optimum bearing hole diameter is 0.03–0.12 mm, depending largely on temperature. Optimum radial clearances in large high-temperature (1000K) rotors can approach 0.1 mm, with optimum orifice diameter 0.4–0.6 mms. More generally, optimum radial clearance $r_c$ (in millimeters) for the high speed anti-whirl gas bearing according to the present invention is now given by the following:

$$r_c = k\, T^{.55}\, r^{.33}$$

where T is the temperature in kelvins, r is the rotor radius in millimeters, and k has numeric value between 0.0006 and 0.001 for nitrogen (with units $K^{-.55} mm^{.67}$). For helium, k has numeric value between 0.001 and 0.0016. Optimum values for hydrogen are similar to those for helium, and optimum values for heavy gas mixtures are similar to those for nitrogen. Significant further increases in clearance result in low stiffness and excessive gas consumption, but this is sometimes necessary at cryogenic temperatures for manufacturing reasons. Somewhat smaller clearances are usually preferred at surface speeds below 0.5 c. It should be noted that these clearances are 3–5 times larger than those required for hydrodynamic (e.g., foil, herringbone grooved, tilting pad, etc.) gas beatings. Hence, reliability and manufacturability are greatly enhanced and friction is greatly reduced. Gas consumption is increased, but this is seldom a significant drawback in either expander turbines or in electric-motor-driven centrifugal or turbine compressors, where an abundant source of pressurized gas is available. Stiffness is much higher than can be achieved in foil-type hydrodynamic bearings, owing to the compliance of the foils. It is sometimes desirable to choose a gas mixture with a higher sonic velocity to reduce heating in ultra-high-speed bearings.

The increased relative clearance achievable with the anti-whirl design of the instant invention is most dramatically shown by the observation that beating gas mass flow with the journal (rotor) in place lies in the range of 50–90% of the beating mass flow with the journal removed for similar applied pressures. Prior art optimum flow ratios are about 35%.

Radial-axial mixed inflow turbines are well known in the power range of 0.5–500 kW with Reynolds numbers of 20,000–1,000,000. but they have usually been considered impractical at lower powers. Exceptions may be found in cryogenics, where the high gas densities and low viscosities permit Reynolds numbers above 20,000 with sub-millimeter blade dimensions.

The radial-inflow microturbine provides much higher isentropic efficiency compared to the prior art impulse (or Pelton) turbines of FIG. 1. Moreover, the purely radial inflow design permits reduced manufacturing costs compared to mixed radial-axial inflow turbines, with no loss in efficiency for this size range—i.e., 1–200 W with Reynolds numbers of 3,000–20,000—owing to the short blade length.

High efficiency single-stage turbines must operate with tip speeds at nominally half the speed of sound or higher. Low power levels require minuscule nozzle area. The radial inflow geometry allows extremely small flow areas at high tip speeds without excessive rotational frequencies when the axial blade length is made extremely short at the perimeter.

Figure 5:
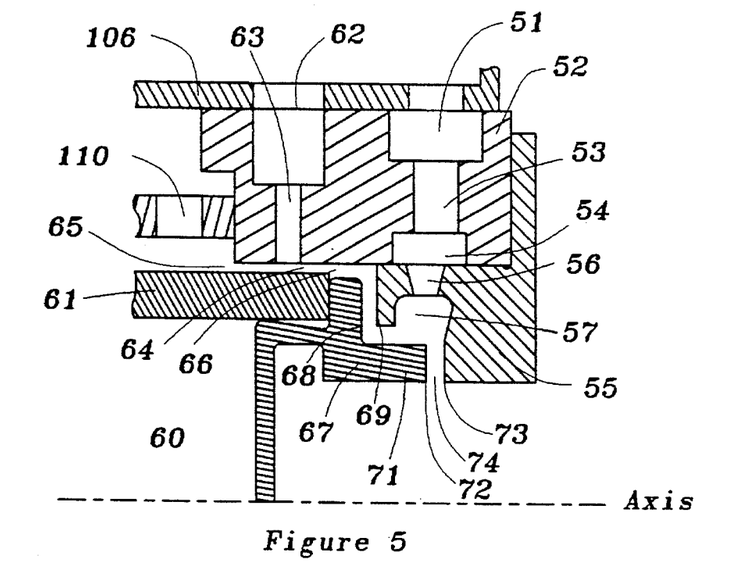
FIG. 5 is a partial longitudinal semi-view of a radial-inflow supersonic microturbine and sample spinner according to a preferred embodiment of the present invention.
Figure 6:
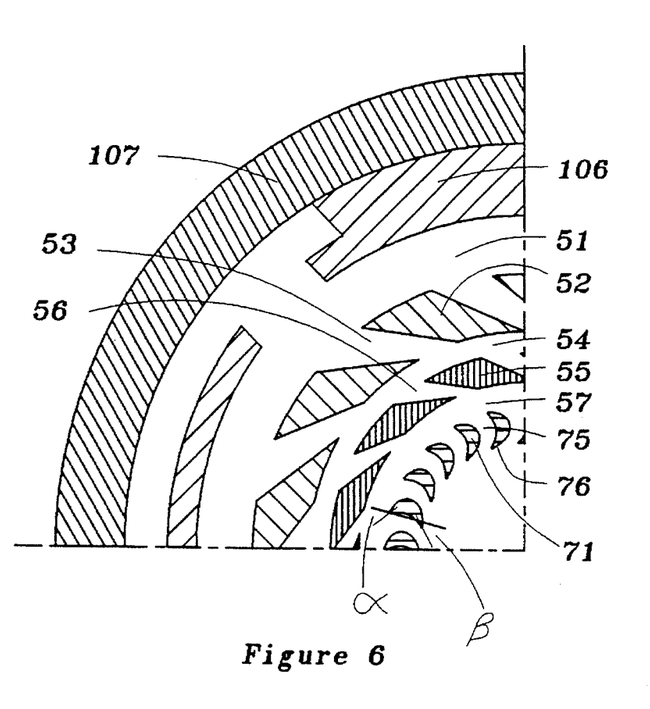
FIG. 6 is a cross section of the microturbine of FIG. 5 showing the supersonic plenum.

FIGS. 5 and 6 disclose the supersonic radial-inflow turbine with axial hydrostatic thrust bearing. Pressurized drive gas is admitted, preferably tangentially at flow velocities below 0.3 c, to a first drive plenum 51 near one end of the bearing stator 52. The drive gas then flows, preferably tangentially at flow velocities below 0.4 c, through a plurality of feed holes 53 in the bearing stator 52 into a second drive plenum 54 formed on the inner surface of the bearing stator 52. The drive gas is then accelerated through converging nozzles 56 to sonic velocity at the perimeter of a third drive plenum 57 in the drive-nozzle stator 55, which is easily removable. Here, conservation of angular momentum causes the drive gas to accelerate to supersonic velocities without separation as the flow radius decreases. Plenum 57 is known in the trade as a vaneless-space, supersonic diffuser. The supersonic drive gas then engages the rotor blades 71.

The sample 60 being studied by the NMR experiment or being ultra-centrifuged is contained in a ceramic cylindrical rotor 61 that is supported radially on anti-whirl hydrostatic air bearings as discussed above. The pressurized bearing air is admitted to a bearing plenum 62. Bearing orifices 63 in the bearing stator 52 are oriented so as to admit bearing air jets into the radial bearing clearance space 64 between the rotor and bearing stator that oppose the rotation of the rotor 61. Bearing gas is allowed to escape axially toward the center 65 of the spinner assembly and over the rotor end 66. A plastic turbine cap 67 is pressed into the end of the rotor to contain the sample and to provide axial stability and drive. The turbine cap includes an annular cap-bearing land 68 to provide an axial thrust bearing in cooperation with a annular stator-bearing land 69 on the nozzle stator 55.

Radial-inflow airfoil blades 71 protrude axially from an annular extension of the cap 67 beyond the cap bearing land 69. Supersonic gas from the third drive plenum 57 impinges on the outer diameter of the blades 71. The blades have an entrance angle, α, of 0°–70°. The gas flows radially inward over the airfoil blades 71 and exits the blades radially inward off the trailing edge of the blades at an exit angle, β of typically 20°–75° in the negative direction. The gas flow turns to exhaust axially after it passes the inner diameter of the blades. The blade length need not be constant in the radial or axial directions. The axial angle of the blade ends 72 is less than 30° —usually 0°—to keep the flow substantially radial. The gas is not allowed to exhaust over the blades with a substantial axial component.

The outer (or entrance) diameter of the turbine blade group is less than 85% of the diameter of the sample container cylindrical rotor 61. This novel relationship is precisely the inverse of conventional turbine bearing design. The reduced turbine diameter permits the attainment of the highest possible bearing surface speeds at highest efficiency. This relationship also simplifies the incorporation of an axial thrust bearing between the turbine and the radial bearing. The radial blade dimension is less than 30% of the outer diameter of the turbine blade group to allow higher exhaust gas velocity without swirl.

The radial-inflow blade geometry of the instant invention permits high efficiency with greatly simplified manufacturing of hard ceramics and composites owing to the absence of compound angles and their resulting concave contours of small radii at the base of the blades. The blade surfaces are generally parallel to the axis. The geometry of the blade ends 72 also simplifies the requirement of making the axial-end leakage past the blades very small by simplifying the shroud geometry. The critical shroud clearance surface 73 is usually simply flat or slightly conical but it may also be slightly convex. depending on the blade end geometry. Blade axial end clearance 74 ideally should be several percent of the axial blade length. It will typically be under 15% of the axial blade length in microturbines. Clearances over twice that large will also perform satisfactorily for low reaction designs. Axial blade length at the perimeter is typically 0.2–1 mm. A relatively small number of blades, typically 6–18, is preferred for high temperature ceramic microturbines to permit the use of larger diamond tooling and to increase the Reynolds number, but room temperature plastic microturbines will typically have 12–40 blades. Continuously inwardly decreasing cross sectional flow area passages 75 and sharp trailing blade edges 76 are required for minimum flow separation and high efficiency.

Figure 7:
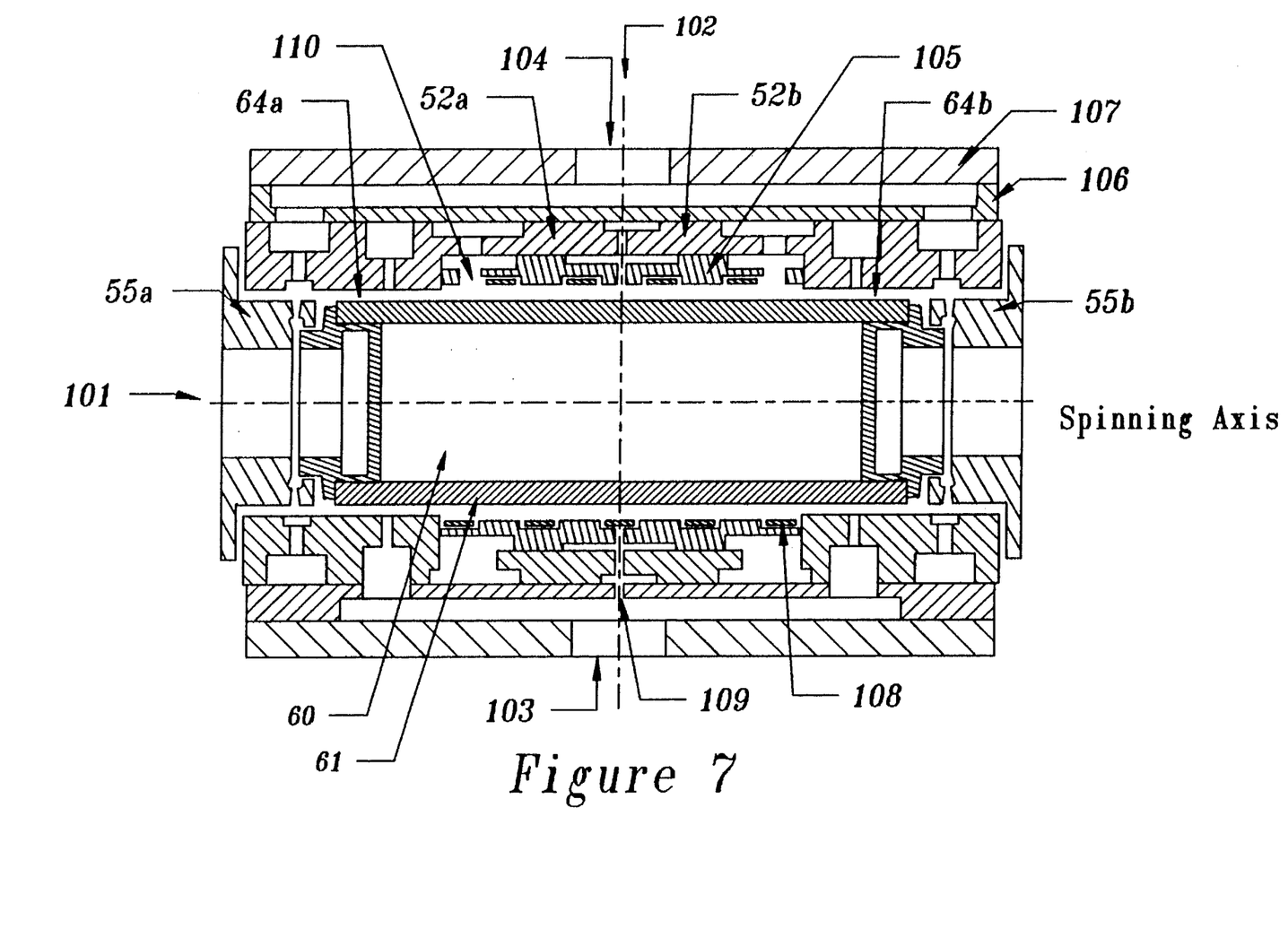
FIG. 7 is a longitudinal view of a supersonic NMR sample spinner according to a preferred embodiment of the present invention.

The complete NMR sample spinner assembly is shown in FIG. 7. The spinning axis 101 must be oriented at various orientation angles with respect to the external magnetic field for various NMR experiments. It is sometimes necessary—in switched angle spinning, for example—to change the angle of orientation very rapidly by rotating the spinner assembly through a small angle about a support axis 102 that is perpendicular to the spinning axis and intersects the center of the sample 60. Symmetry of the rotor and turbine caps about a line perpendicular to and bisecting the spinning axis 101 is essential so that the orientation angle of the axis of rotation can be changed very rapidly without producing substantial axial forces on the rotor.

Pressurized bearing gas is admitted through the bearing port 103 on one side of the spinner assembly, and pressurized drive gas is admitted through the drive port 104 on the opposite side. The bearing stator assembly is made in five parts: the coil support form 105: two bearing stators 52a, 52b; a manifold sleeve 106; and an outermost cylinder 107. This arrangement permits simplified manufacturing from hard ceramics and simplified mounting of the radio frequency coil 108 on the inside of the coil form 105. High speed spinning results in considerable heating in the bearing regions 64a, 64b. A central orifice 109 allows cooling air to flow from the bearing port over the central portion of the rotor 61 and coil 108 and exhaust with bearing air out bearing exhaust ports 110. Easily removable nozzle stators 55a, 55b are inserted and secured into each end of the spinner assembly for ease of sample change.

The bearing heating may be reduced by mixing up to 3% (by mass) hydrogen in nitrogen without creating hazardous conditions. The bearing heating may also be reduced by mixing some helium into an otherwise substantially all nitrogen atmosphere. Up to 5% helium in nitrogen is possible without creating serious high voltage arcing problems. Up to 20% helium in a heavy inert gas mixture may be preferred in applications where low Prantl numbers are beneficial—such as in very large closed Brayton cycles.

The superior stability and efficiency of the instant gas bearing makes it particularly well suited to poorly balanced and dynamic samples, such as the larger spinner in the "spinner within a spinner" or "DOuble Rotation" (DOR) technique for second order NMR averaging experiments by high speed spinning about two axes simultaneously. However, some adaptations are necessary for the inner DOR spinner, such as disclosed in U.S. Pat. No. 4,899,111. Surface speeds of both the inner and outer spinners in prior art DOR NMR spinners are typically below 0.2 c. Hence, turbine drive efficiency is of less importance than miniaturization and dynamic balance of the inner spinner assembly. Nonetheless, using the instant invention for the outer spinner, with its reduced turbine diameters and efficient axial and radial gas bearings, allows enhanced stability of the outer spinner at all speeds.

Although this invention has been described herein with reference to specific embodiments, it will be recognized that changes and modifications may be made without departing from the spirit of the present invention. All such modifications and changes are intended to be included within the scope of the following claims.

What is claimed is:

1. A high speed gas journal bearing, comprising:

a stator:

a journal inside said stator and having a radial clearance between said stator and said journal;

said stator having a plurality of holes for supplying gas into said radial clearance; and at least one turbine attached to said journal, said at least one turbine having a diameter less than 85% of the diameter of said journal.

2. The journal bearing as recited in claim 1, further comprising a supersonic vaneless diffuser in said stator.

3. The journal bearing as recited in claim 1, wherein each of said turbines is a radial inflow turbine.

4. A high speed gas journal bearing comprising:

a cylindrical bearing sleeve;

a journal supported concentrically by pressurized gas inside said cylindrical bearing sleeve:

said bearing sleeve larger than said journal by a radial clearance distance $r_c$;

said radial clearance extending for an axial length that is greater than 35% and less than 70% of the diameter of said journal so as to form a cylindrical bearing clearance region:

a plurality of oblique air-bearing holes having bearing hole exit ellipses for supplying pressurized gas into said radial clearance region through said bearing hole exit ellipses;

drive means connected to said journal for causing said journal to rotate within said sleeve with a surface velocity opposite in direction to the net circumferential component of said gas entering said clearance region from said exit ellipse.

5. The bearing as recited in claim 4, wherein said radial clearance distance $r_c$ in mm is given by the following expression:

$$r_c = k\, T^{.55}\, r^{.33}$$

where T is the gas temperature in kelvins, r is the journal radius in millimeters, and k has numeric value between 0.0006 and 0.0016 with appropriate units.

6. The beating as recited in claim 4, wherein the axes of said oblique air-beating holes are inclined at a circumferential angle greater than 10° with respect to the plane defined by the axis of said journal and the centers of said exit ellipses and wherein the axes of said holes are inclined at a longitudinal angle less than 25° with respect to a plane perpendicular to the axis of said journal.

7. The beating as recited in claim 6, wherein said bearing holes having minimum diameter greater than 0.03 millimeters and less than 0.6 millimeters, and said bearing hole diameter is chosen so that the mass flow of said gas with said journal centered in said sleeve lies in the range of 50–90% of the mass flow of said gas with said journal removed while similar gas pressures are applied.

8. The bearing as recited in claim 4, wherein said journal and said sleeve are made from ceramics.

9. The bearing as recited in claim 4, wherein said surface velocity is greater than 0.3 times the local stagnation velocity of sound in said exit ellipse.

10. The bearing as recited in claim 4, wherein said gas contains less than 3% mass fraction of hydrogen and more than 1% but less than 20% mass fraction helium.

11. The bearing as recited in claim 6, wherein said circumferential angle is greater than 15° and less than 30°.

12. The beating as recited in claim 10, wherein more than 80% of the mass fraction of said gas has mean molecular weight greater than 27.

13. The beating as recited in claim 4, wherein said drive means is selected from the group consisting of a turbine and an electric motor.

14. A plurality of axially spaced apart bearings as recited in claim 4, wherein the axes of each of said plurality of axially spaced apart beatings are coincident and each said bearing is provided with means for exhausting said bearing gas at the end thereof.

15. The bearing as recited in claim 4, wherein said sleeve includes chamfers at each axial end thereof.

16. A high speed sample spinner, comprising:

a cylindrical bearing stator;

a first cylindrical sample container inside said cylindrical bearing stator and positioned so that said first sample container can be supported on a hydrostatic cylindrical gas bearing, said first sample container having two ends;

said cylindrical bearing stator including a plurality of bearing orifices near said two ends of said first sample container;

a radial-inflow microturbine coaxially and removably attached to said first sample container at one end thereof for spinning said first sample container within said bearing stator;

said microturbine having an axially-disposed annular surface and a group of axially-extending, curved, rotor blades, equally spaced on said annular surface;

each blade of said group having a radial entrance edge at a substantially constant entrance radius from the axis of said annular surface;

each said blade having a radial exit edge at a substantially constant exit radius from the axis of said annular surface such that said exit radius is less than 90% of said entrance radius and greater than 40% of said entrance radius;

each said blade having a free axial end such that each said free axial end sweeps out the same surface of revolution about the axis of symmetry of said annular surface as that swept by the free end of any other said blade;

said blade group having maximum outside diameter less than 85% of the outside diameter of said first sample container;

a drive stator in spaced relation to said microturbine and having an annular drive plenum;

at least one drive nozzle directing pressurized gas with a substantially circumferential velocity into said annular drive plenum in said drive stator;

said plenum located in the plane of and radially outside of the perimeter of said microturbine for communication with said microturbine;

said drive stator including an axial flow shroud surface, substantially congruent with said surface of revolution, for inhibiting axial flow over said blades and defining radial gas flow passages between said blades; and a housing for distributing pressurized gas to said bearing orifices and said turbine nozzle.

17. The high speed sample spinner as recited in claim 16, said sample spinner for use in NMR experiments in magnetic fields and further comprising:

a cylindrical coil form surrounding the central portion of said first sample container;

a radio frequency coil supported by said cylindrical coil form;

said bearing orifices inclined at a circumferential angle that is opposite in direction to the circumferential angle of said drive nozzle.

18. The high speed sample spinner as recited in claim 17, wherein said gas in said drive plenum attains supersonic velocities with respect to said drive stator before impinging on said microturbine.

19. The high speed sample spinner as recited in claim 17, further comprising:

an annular hydrostatic thrust bearing located axially between said microturbine and said first sample container;

said thrust bearing having inside radius not less than said microturbine entrance radius and having outside radius not greater than the radius of said first sample container;

said sample container having two of said bearing stators, two of said drive stators, and two of said microturbines symmetrically located with respect to an axis perpendicular to and bisecting the axis of said first sample container;

said housing including at least two concentric cylindrical means for defining a plurality of air passageways and plenums;

said coil form supported inside said housing by said cylindrical coil form;

said bearing stator containing a bearing plenum and a drive plenum;

said drive stator being easily removable; and said bearing stators, said drive stators, and said housing made from ceramic materials.

20. The high speed sample spinner as recited in claim 17 wherein said first sample container contains a second sample container inside said first sample container oriented so that the axes of said first and said second sample containers are not coincident.

21. A high speed sample spinner microturbine, comprising:

a cylindrical plug having a cylindrical flange;

a ring having an axial surface, said ring extending concentrically from said cylindrical flange;

a group of axially-extending, curved, rotor blades, equally spaced on said axial surface of said ring;

each said blade having a radial entrance edge at a substantially constant entrance radius from the axis of said ring;

each said blade having a radial exit edge at a substantially constant exit radius from the axis of said ring such that said exit radius is less than 90% of said entrance radius and greater than 40% of said entrance radius;

each said blade having a free axial end such that each said free axial end sweeps out the same surface of revolution about the axis of symmetry of said ring as that swept by the free end of any other said blade;

said blades forming a group of blades having maximum outside diameter less than the outside diameter of said flange;

said blades having side surfaces substantially parallel to said axis;

said blades having a mean flow entrance angle between 0° and 75° with respect to the radius and an exit angle between 20° and 75° with respect to the radius in the negative direction;

said blades each having side surfaces defining radial gas flow passages that present continuously decreasing cross sectional flow area to a drive gas;

said blades having axial length less than 1 mm at said entrance edge; and said entrance radius ranging between 1 and 15 mm.

* * * * *

UNITED STATES PATENT AND TRADEMARK OFFICE
CERTIFICATE OF CORRECTION

PATENT NO. : 5,508,615            Page 1 of 2
DATED      : April 16, 1996
INVENTOR(S): F. David Doty, Lester G. Hacker, and Jonathan B. Spitzmesser It is certified that error appears in the above-indentified patent and that said Letters Patent is hereby corrected as shown below:

Col. 1, Ln. 56, change "Beating" to --Bearing--.
Col. 1, Ln. 60, change "beating" to --bearing--.
Col. 4, Lns. 25-28, change "$r_c k\ T^{.55} r^{.33}$" to --$r_c = k\ T^{.55} r^{.33}$--.
Col. 4, Ln. 41, change "beating" to --bearing--.
Col. 4, Ln. 53, change "beating" to --bearing--.
Col. 4, Ln. 55, change "beating" to --bearing--.
Col. 4, Ln. 60, change "." to --,--.
Col. 5, Ln. 32, change "beating" to --bearing--.
Col. 5, Ln. 33, change "beating" to --bearing--.
Col. 6, Ln. 42, change "beating" to --bearing--.
Col. 7, Ln. 43, change "air-beating" to --air-bearing--.
Col. 7, Ln. 43, change "beating" to --bearing--.
Col. 7, Ln. 52, change "beating" to --bearing--.
Col. 7, Ln. 61, change "beating" to --bearing--.
Col. 7, Ln. 62, change "beating" to --bearing--.
Col. 8, Ln. 1, change "beating" to --bearing--.
Col. 8, Ln. 17, change "beating" to --bearing--.
Col. 8, Ln. 20, change "beating" to --bearing--.
Col. 8, Ln. 25, change "beating" to --bearing--.

UNITED STATES PATENT AND TRADEMARK OFFICE
CERTIFICATE OF CORRECTION

PATENT NO. : 5,508,615
DATED : April 16, 1996
INVENTOR(S) : F. David Doty, et al It is certified that error appears in the above-indentified patent and that said Letters Patent is hereby corrected as shown below:

Col. 9, line 8, change "beating" to —bearing—.

Signed and Sealed this

Tenth Day of September, 1996

Attest:

BRUCE LEHMAN

Attesting Officer

Commissioner of Patents and Trademarks